United States Patent
Esmark et al.

(10) Patent No.: US 6,905,892 B2
(45) Date of Patent: Jun. 14, 2005

(54) OPERATING METHOD FOR A SEMICONDUCTOR COMPONENT

(75) Inventors: Kai Esmark, München (DE); Harald Gossner, Riemerling (DE); Philipp Riess, Ossining, NY (US); Wolfgang Stadler, München (DE); Martin Streibl, Petershausen (DE); Martin Wendel, München (DE)

(73) Assignee: Infineon Technologies AG, Munich (DE)

( * ) Notice: Subject to any disclaimer, the term of this patent is extended or adjusted under 35 U.S.C. 154(b) by 448 days.

(21) Appl. No.: 10/200,067

(22) Filed: Jul. 19, 2002

(65) Prior Publication Data

US 2003/0017676 A1 Jan. 23, 2003

(30) Foreign Application Priority Data

Jul. 20, 2001 (DE) .......................................... 101 34 665

(51) Int. Cl.$^7$ .............................................. G01R 31/26
(52) U.S. Cl. ........................ 438/14; 438/381; 438/382; 438/467
(58) Field of Search .................. 438/14, 238, 381–382, 438/466–470

(56) References Cited

U.S. PATENT DOCUMENTS 5,189,387 A   2/1993   Childers et al.
6,258,700 B1 * 7/2001   Bohr et al. .................. 438/467

FOREIGN PATENT DOCUMENTS

EP   0196891 A1   8/1986
EP   0930623 A1   7/1999

* cited by examiner

*Primary Examiner*—H. Jey Tsai
(74) *Attorney, Agent, or Firm*—Slater & Matsil, L.L.P.

(57) ABSTRACT

The present invention creates an operating method for a semiconductor component having a substrate; having a conductive polysilicon strip which is applied to the substrate; having a first and a second electrical contact which are connected to the conductive polysilicon strip such that this forms an electrical resistance in between them; with the semiconductor component being operated reversibly in a current/voltage range in which it has a first differential resistance (Rdiff1) up to a current limit value (It) corresponding to an upper voltage limit value (Vt) and, at current values greater than this, has a second differential resistance (Rdiff2), which is less than the first differential resistance (Rdiff1).

11 Claims, 5 Drawing Sheets

OPERATING METHOD FOR A SEMICONDUCTOR COMPONENT

CROSS-REFERENCE TO RELATED APPLICATIONS

This application claims the benefit of German Patent Application No. 101 34 665.4 filed on Jul. 20, 2001 the disclosures of which are incorporated by reference herein in their entirety.

DESCRIPTION

The present invention relates to an operating method for a semiconductor component having a substrate, having a conductive strip composed of a semiconductor material which is applied to the substrate, having a first and a second electrical contact which are connected to the conductive strip such that this forms an electrical resistance in between them.

Although, in principle, any semiconductor components with switch characteristics can be used, the present invention and the problems on which it is based will be explained with reference to trigger diodes based on silicon technology.

Trigger diodes are semiconductor components which switch from a blocking state to a switched-on state when the voltage which is applied between the two connections exceeds a specific value and, in the process, greatly reduce their differential resistance. One known type of a trigger diode is the so-called four-layer diode (Binistor), which is sometimes also referred to as a breakover diode and is equally a thyristor which has no control electrode but makes use of breakdown triggering.

Trigger diodes and other known current and voltage switchable semiconductor components, such as controlled transistors (JFETs, NMOS, etc.), thyristors, TRIACs and DIACs as well as bipolar transistors for high-current pulse shaping have the following disadvantages:

a. complex multilayer structure;

b. restricted adaptability of the key parameters within the specified manufacturing technology;

c. a high level of development effort, resulting from the complex method of operation;

d. complex and time-consuming process engineering (a large number of mask levels, etc.);

e. no compatibility for integration in conventional VLSI processes;

f. lack of stability with respect to technology fluctuations and transfer to different production sites; and g. large area and space requirements in VLSI circuits.

One object of the present invention is thus to provide an operating method for a semiconductor component, which can easily be integrated in a VLSI process, in order to achieve a current-switched or voltage-switched switch characteristic.

According to the invention, this object is achieved by the operating method specified in claim 1.

The idea on which the present invention is based is to allow the initially mentioned semiconductor component to be operated reversibly in a current/voltage range in which it has a first differential resistance up to a first current limit value corresponding to an upper voltage limit value and, at current values greater than this, has a second differential resistance, which is less than the first differential resistance.

The operation, according to the invention, of the component which is known per se in the form of a strip composed of a semiconductor material is distinguished by the simplicity of production, design and integribility in modern CMOS, BiCMOS and bipolar technologies for the component, and by its excellent linearity in the two operating modes, with a high and a low differential resistance. One excellent feature of the novel operation is undoubtedly the full adjustment capability of the key parameters within one manufacturing technology, just by means of layout measures, and hence the capability to use a number of such components, with a different characteristic, in a large scale integrated product.

According to the invention, the known resistance strip is used reversibly, with a different differential resistance, in two operating states. Reversibly relates, by way of example, to non-destructive operation in the DC mode or at least in the pulsed mode, with a typical duty ratio of 1 ms [sic].

When the current level is low, the resistance assumes a specific nominal value and, when a specific threshold current or a specific threshold voltage is exceeded, the component switches to a more highly conductive state, with a lower differential resistance.

The characterizing parameters of this switchable resistor are the two differential resistances Rdiff1 and Rdiff2, the limit voltage Vt, the limit current It and the upper limit of the reversible operating range, characterized by the critical current Ik. If required, the component may also have a blocking range up to a threshold value of Vth<Vt.

The use of the polysilicon resistor according to the invention has the following further advantages over the prior art:

a. simple structure, capability for implementation easily using all technologies;

b. full adaptability of the key parameters possible just by means of layout measures ("custom design");

c. simple internal structure linked to a low level of development effort;

d. short process time;

e. seamless integribility in conventional VLSI processes;

f. high stability with respect to technology fluctuations and transfer to different production sites, by virtue of a robust internal structure; and g. small area requirements in VLSI circuits owing to good integribility and the comparatively high current carrying capacity per unit area (the area advantage is a factor of 2 to 10).

The dependent claims contain advantageous developments and improvements of the respective subject matter of the invention.

According to a further preferred development, the strip has a sheet resistance which is in the range between 100 and 1000 ohms per square.

According to a further preferred development, the strip has a cuboid shape with a length l, a width b and a height h.

According to a further preferred development, the strip is formed from a number of strip elements with different dopings and/or lengths so as to produce a predetermined voltage limit value.

According to a further preferred development, the strip elements are alternately p-doped and n-doped.

According to a further preferred development, the alternate doping creates additional diode forward-bias thresholds in the current path.

According to a further preferred development, the alternate doping creates additional diode breakdown thresholds in the current path.

According to a further preferred development, the voltage limit value Vt is set in accordance with the relationship Vt=R b(k/Rsq)1/2, where R is the resistance, b is the width, k is a constant and Rsq is the sheet resistance of the strip.

According to a further preferred development, the semiconductor component is used as an ESD protective element.

According to a further preferred development, the semiconductor component is used with two functions, as an ESD protective element and as a bias resistor, in a radio-frequency circuit arrangement.

According to a further preferred development, the strip is formed from doped polysilicon as the semiconductor material.

Exemplary embodiments of the invention will be explained in more detail in the following description and are illustrated in the drawings, in which.

Identical reference symbols in the figures denote identical or functionally identical components.

Figure 1:
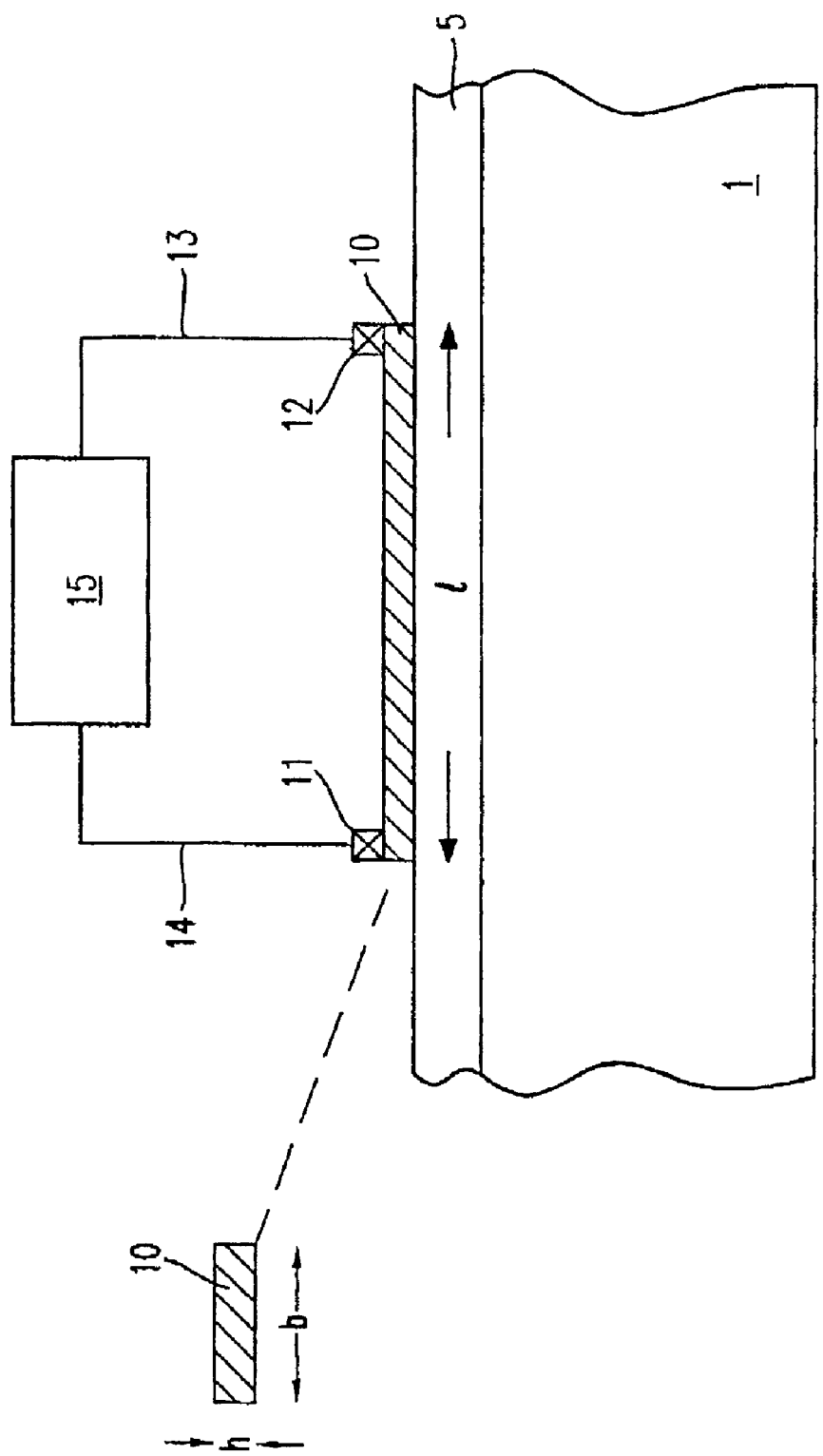
FIG. 1 shows a schematic illustration of a polysilicon resistor on a substrate, in order to explain a first embodiment of the present invention.

In FIG. 1, the reference symbol 1 denotes a silicon wafer substrate, on which an insulation layer 5, for example composed of silicon dioxide, is applied. A cuboid polysilicon strip with a length l, a width b and a height h is provided on the insulation strip 5, and is denoted by the reference symbol 10. The technological production of such a polysilicon strip 10 is well known from the prior art. Chemical vapor deposition with subsequent structuring of doped polysilicon may be mentioned as one example. With a known technology, by way of example, the height h of the polysilicon resistance strip is about 0.15 μm, the width b is in the region of a few micrometers, and the length l is in the region of a few tens of micrometers.

The sheet resistance of the deposited polysilicon, and hence the resistance of the polysilicon strip 10, may be varied within a very wide value range by the doping level, for example using boron, arsenic, phosphorus and the like. Comprehensive investigations have been carried out in the value range from 100 to 1000 Ω/sq in conjunction with the described embodiment. Contacts 11, 12 are fitted in the normal way to the ends of the polysilicon strip 10 and are connected to lines 13, 14, which are in turn connected to the connections of a controllable current source 15.

Figure 2:
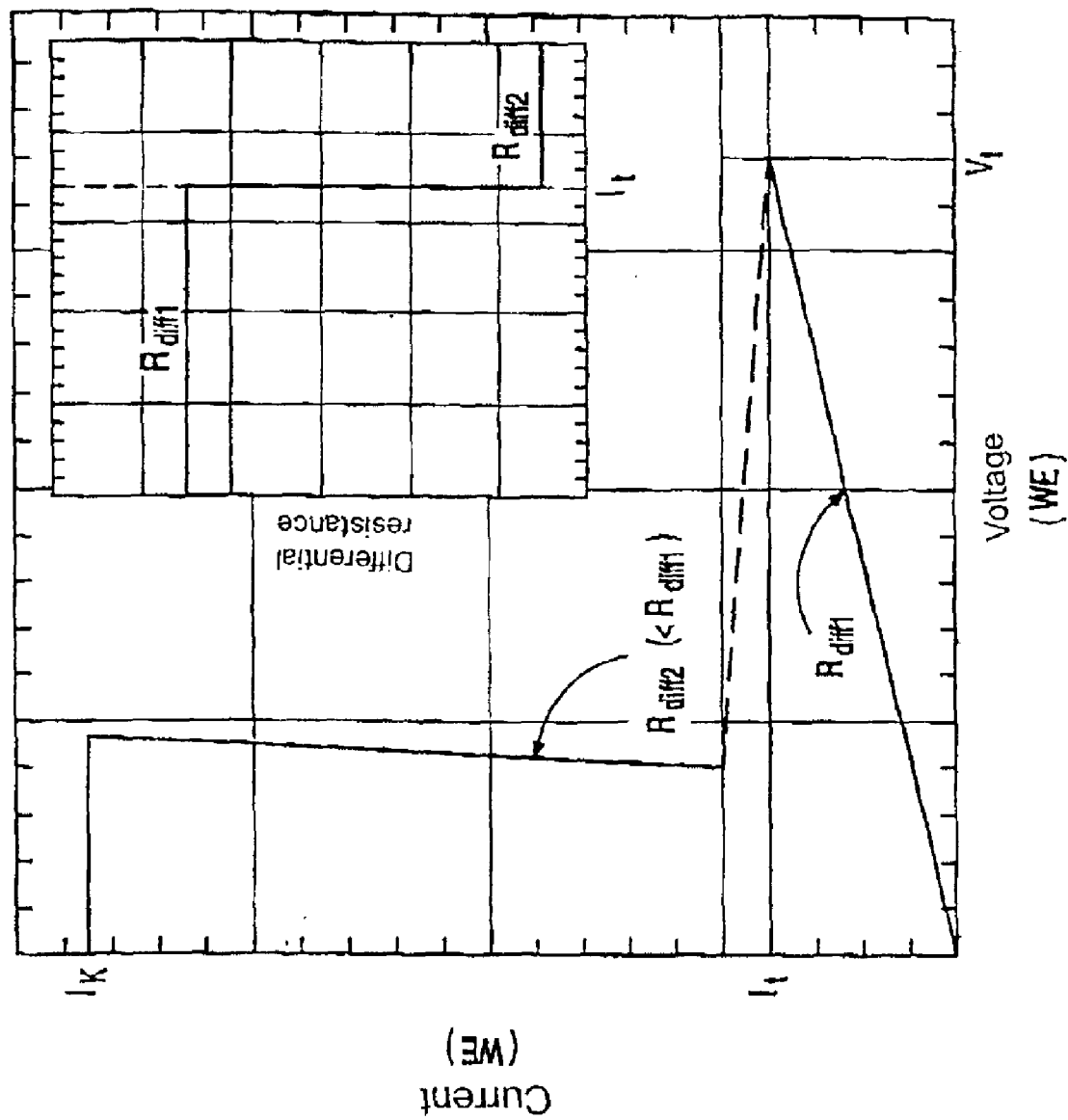
FIG. 2 shows the response of the differential resistance and the current/voltage characteristic of the polysilicon strip for the first embodiment of the operating method according to the invention.

The response of the differential resistance and of the current/voltage characteristic of the polysilicon strip 10 for the first embodiment of the operating method according to the invention are illustrated in FIG. 2.

During operation, the controllable current source 15 makes it possible to provide the polysilicon strip with a reversible response, with the polysilicon strip having a first differential resistance Rdiff1 up to a current limit value It corresponding to an upper voltage limit value Vt, and having a second differential resistance Rdiff2, which is less than the first differential resistance Rdiff1, at current levels above this.

As can clearly be seen from FIG. 2, this response is the same as the response of a known DIAC. In particular, all that need be remembered is that the current may be limited to a critical upper current value Ik, above which irreversible changes occur in the polysilicon, for example fused channels.

Typical test conditions for the controllable current source 15 illustrated in FIG. 1 are pulse measurements in the 100 nanosecond range, with the polysilicon strip 10 being observed to have recovery times for reaching the higher resistance, starting from the lower one, in the millisecond range.

The switching of the resistor in the form of the polysilicon strip 10 can be explained by the current limit value It being exceeded such that this leads to the resistor being flooded with charge carriers by means of thermal generation. Analytically, this switching can be described by a specific electrical power Vt×It being supplied in a specific resistor volume b×l×h, where b, h, l are the above-mentioned dimensions of the polysilicon strip 10.

The definition $$\frac{V_t \times I_t}{l \times b} = k = \text{constant}$$

and the definition of the sheet resistance Rsq by $$R = Rsq \frac{l}{w}$$

results in the relationship $$Vt = Rb \sqrt{\frac{k}{R_{sq}}} \qquad (1)$$

In this case, the voltage limit value Vt can be varied by the width of the polysilicon resistor, the resistance R and by the specific resistance or resistivity. R is normally governed by the application, and the minimum width b of the resistor is governed by the electromigration requirements and/or the maximum current carrying capacity.

Virtually any desired resistance from a few ohms up to the Megaohm range can be achieved, with an acceptable surface area, by the combination of different resistor dopings in polysilicon or by using diffusion resistors (for example n+/n-/intrinsic) so that the limit voltage Vt can be varied over a very wide range.

Figure 3:
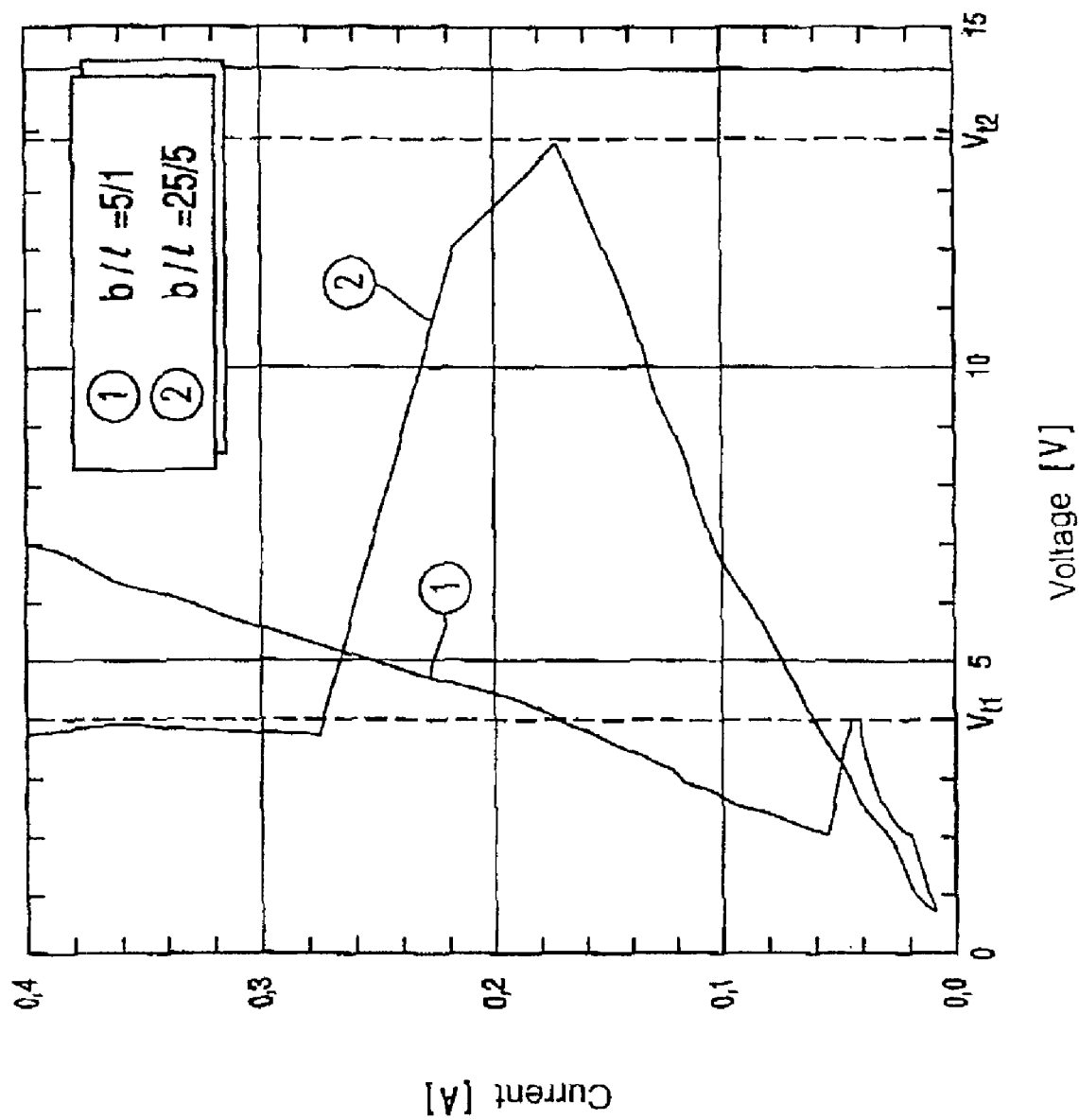
FIG. 3 shows a current/voltage characteristic with two selected resistors with the same nominal resistance.

FIG. 3 shows a current/voltage characteristic with two selected resistors, with the same nominal resistance. The curve (1) shows the response for a ratio b/l=5/1, and the curve (2) shows the response for a ratio b/l=25/5. It can clearly be seen that the limit voltage Vt2 becomes greater as the width l increases, that is to say Vt2=13.8 V is greater than Vt1=4 V.

Figure 4:
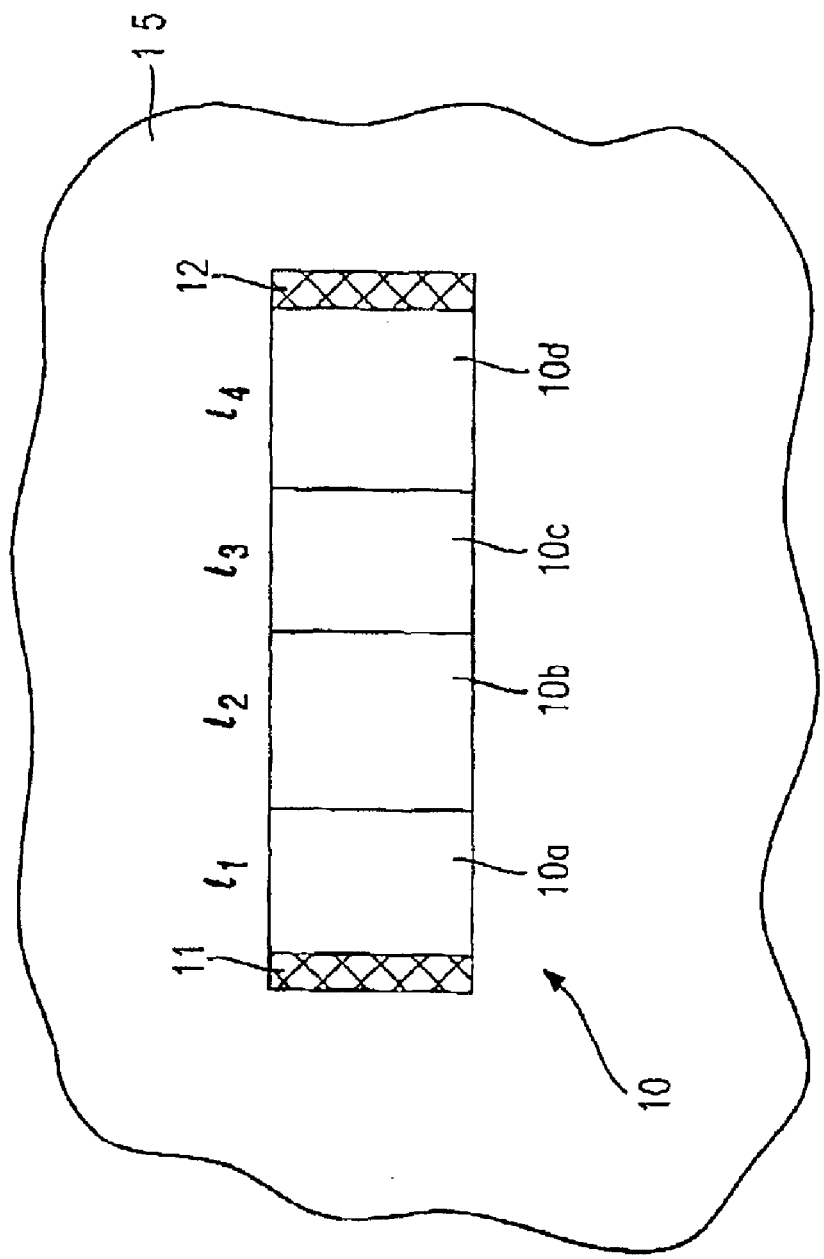
FIG. 4 shows the arrangement of a polysilicon strip in order to explain a second embodiment of the operating method according to the invention.

FIG. 4 shows the arrangement of a polysilicon strip in order to explain a second embodiment of the operating method according to the invention.

According to this second embodiment, the polysilicon strip 10 is formed from a number of strip elements 10a–10d, which have different doping and/or a different length 11–14, so that a predetermined voltage limit value Vt can be achieved over a wide value range by appropriate series connection. Such connection can be achieved by means of the fuse principle, by laser trimming, or by other conventional techniques.

Figure 5:
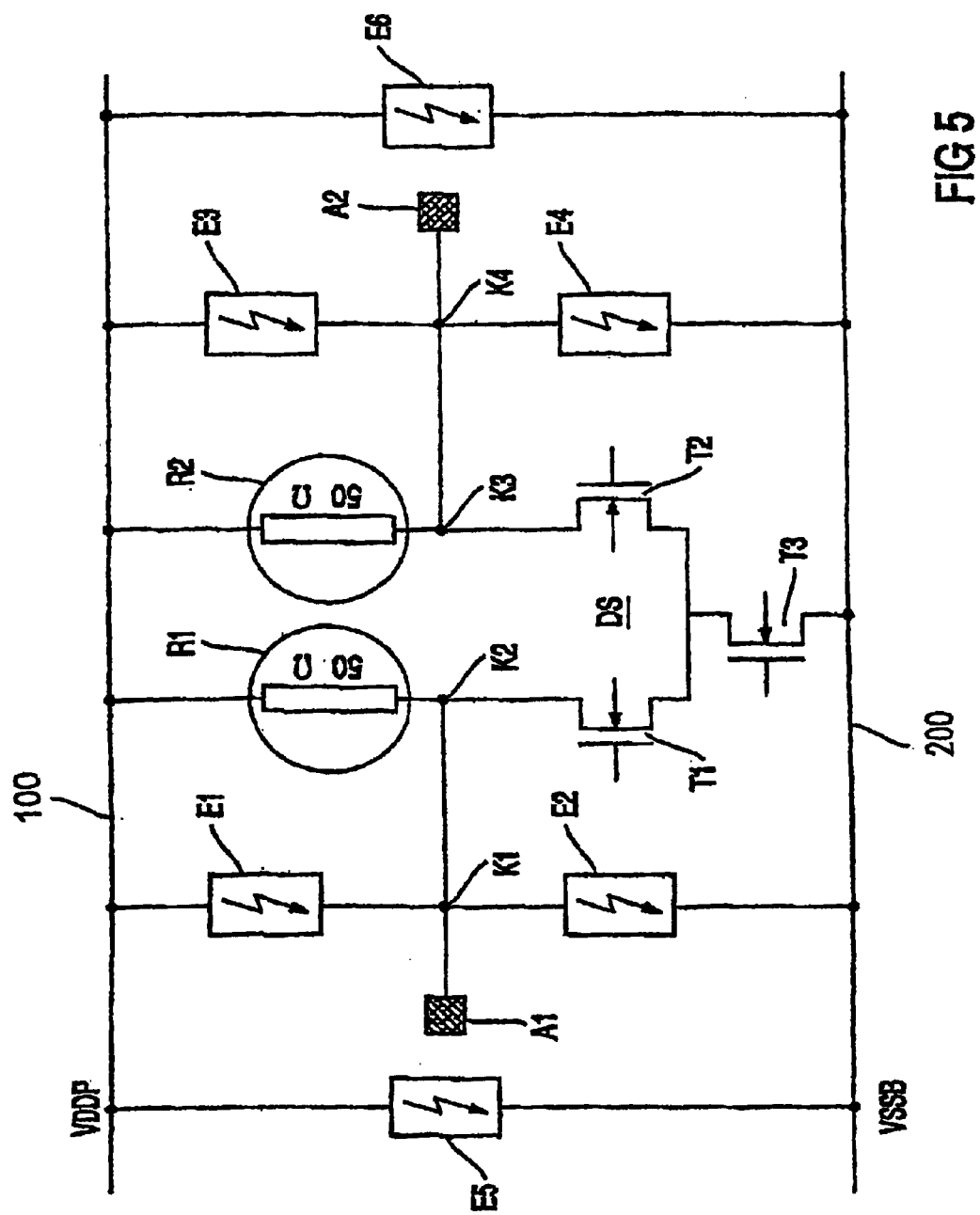
FIG. 5 shows a radio-frequency circuit arrangement in order to explain one field of application of the operating method according to the invention.

FIG. 5 shows a radio-frequency circuit arrangement in order to explain one field of application of the operating method according to the invention.

In FIG. 5, 100, 200 respectively denote a first and a second supply voltage line. E1 to E6 are ESD protective elements, for example trigger diodes, which are provided between the two supply lines. A1, A2 are, respectively, a first and a second radio-frequency path for injection of a radio-frequency signal, and they are respectively connected to the circuit nodes K1 and K4, which in turn form center nodes for the ESD protective elements E1, E2 and E3, E4, respectively.

A differential stage, which is denoted by DS and has two input transistors T1, T2 and one output transistor T3, is provided in the center of the circuit. Further details of this differential stage are known and will not be explained in any more detail here. 50 Ω resistors R1 and R2 are provided as bias resistors for the differential stage DS and are connected via the respective circuit nodes K2 and K3 to the transistors T1, T2. Furthermore, the nodes K2, K3 are at the same potential as the respective nodes K1 and K4.

The particular difficulty of ESD protection in a radio-frequency circuit arrangement such as this is the very small tolerable capacitance plates which can be used for ESD protection. Until now, effective ESD protection has is been impossible to achieve in many cases. The use of the polysilicon strip 10 according to the invention as a switchable resistor allows these previous problems to be overcome.

For this purpose, the resistors R1, R2 are simply each replaced by a polysilicon strip according to the invention and of appropriate size, in which case the ESD protective elements E1 and E3 may be omitted at the same time. Since the parameters of the width d and the resistance R of these resistors can be varied independently of one another, it is possible, as shown in FIG. 4, to design a 50 Ω resistor with a specific b/l ratio, which has a suitable limit voltage Vt2, for example of several hundred volts, which is suitable for this application.

A suitable layout thus allows the polysilicon strip 10 to be used as the resistor R1 or R2, and at the same time as the ESD protective element E1 or E3, respectively. This leads to a significant saving in surface area, and at the same time to improved performance, since there is no need for any additional capacitance plates in the form of additional ESD protective elements E1, E2.

A resistance layer of p+ polysilicon with 310 Ω/sq will be used as a specific example for the design of a polysilicon resistor strip in a radio-frequency circuit arrangement 50 as shown in FIG. 5. For electromigration reasons, b must be greater than 15 micrometers. With the relationship (1) quoted above, b is 20 micrometers, so that the electromigration condition is satisfied, and an ESD resistance of approximately 1 kV is achieved. Should greater widths b be required owing to electromigration or ESD protection, the sheet resistance may be increased by changing the doping.

Although the present invention has been described above on the basis of preferred exemplary embodiments, it is not restricted to these, but may be modified in a large number of ways.

In particular, the present invention is not restricted to polysilicon or to a specific type of polysilicon doping. In addition, the quoted applications are only by way of example and may be extended as required to any fields of application where switchable resistors are required.

The strip may also have any other desired geometries.

Typical further fields of application for the method according to the invention are:

a. nonlinear pulse shaping of high-speed current pulses, for example in laser diode drivers;

b. fields of application of a DIAC, for example triggering of TRIACs and thyristors for high-current/high-voltage and smart power applications;

c. non-destructive dissipation of high-current pulses, for example of electrostatic discharges (ESD protective elements), lightning protection circuits;

d. latch-up protection circuits;

e. applications in the high-current field, in which the power loss is intended to be limited for high current densities.

What is claims is:

1. Operating method for a semiconductor component having:

a substrate;

a conductive polysilicon strip which is applied to the substrate;

a first and a second electrical contact, which are connected to the conductive polysilicon strip such that this forms an electrical resistance in between;

with the semiconductor component being operated reversibly in a current/voltage range in which it has a first differential resistance (Rdiff1) up to a current limit value (It) corresponding to an upper voltage limit value (Vt) and, at current values greater than this, has a second differential resistance (Rdiff2), which is less than the first differential resistance (Rdiff1).

2. Method according to claim 1, characterized in that the strip has a sheet resistance which is in the range between 100 and 1000 ohms per square.

3. Method according to claim 1, characterized in that the strip has a cuboid shape with a length l, a width b and a height h.

4. Method according to claim 1, characterized in that the strip is formed from a number of strip elements with different dopings and/or lengths, with the strip elements being combined in series so as to produce a predetermined voltage limit value (Vt).

5. Method according to claim 4, characterized in that the strip elements are alternately p-doped and n-doped.

6. Method according to claim 5, characterized in that the alternate doping creates additional diode forward-bias thresholds in the current path.

7. Method according to claim 5, characterized in that the alternate doping creates additional diode breakdown thresholds in the current path.

8. Method according to one of claim 3, with the voltage limit value Vt being set in accordance with the relationship $$Vt = R\ b(k/Rsq)1/2,$$

where R is the resistance, b is the width, k is a constant and Rsq is the sheet resistance of the strip.

9. Method according to claim 1 wherein, with the semiconductor component is used as an ESD protective element.

10. Method according to claim 9, with the semiconductor component being used with two functions, as an ESD protective element and as a bias resistor, in a radio-frequency circuit arrangement.

11. Method according to claim 1, with the strip being formed from doped polysilicon as the semiconductor material.

* * * * *